United States Patent
Echigo et al.

(10) Patent No.: US 6,916,706 B2
(45) Date of Patent: Jul. 12, 2005

(54) CAPACITOR SHEET, METHOD FOR PRODUCING THE SAME, BOARD WITH BUILT-IN CAPACITORS, AND SEMICONDUCTOR DEVICE

(75) Inventors: Fumio Echigo, Osaka (JP); Tadashi Nakamura, Suita (JP); Daizo Andoh, Katano (JP)

(73) Assignee: Matsushita Electric Industrial Co, Ltd., Osaka (JP)

( * ) Notice: Subject to any disclaimer, the term of this patent is extended or adjusted under 35 U.S.C. 154(b) by 0 days.

(21) Appl. No.: 10/833,817

(22) Filed: Apr. 27, 2004

(65) Prior Publication Data

US 2004/0201367 A1 Oct. 14, 2004

Related U.S. Application Data

(62) Division of application No. 10/155,700, filed on May 24, 2002, now Pat. No. 6,756,628.

(30) Foreign Application Priority Data

May 30, 2001 (JP) ......................................... 2001-161928

(51) Int. Cl.[7] ......................................... H01L 21/8242
(52) U.S. Cl. ...................... 438/253; 257/306; 257/307; 257/308; 438/239
(58) Field of Search ................................. 438/253, 239; 257/306, 307, 308

(56) References Cited

U.S. PATENT DOCUMENTS 6,510,045 B2    1/2003  Mido et al.
6,606,237 B1 *  8/2003  Naito et al. .............. 361/306.3
6,795,295 B2 *  9/2004  Murakami et al. ....... 361/306.3
2002/0158712 A1  10/2002  Yamaguchi

FOREIGN PATENT DOCUMENTS

JP    5-36857    2/1993
JP    5-205966   8/1993
JP    8-148595   6/1996

\* cited by examiner

Primary Examiner—Thao P. Le
(74) Attorney, Agent, or Firm—Hamre, Schumann, Mueller & Larson, P.C.

(57) ABSTRACT

A capacitor sheet includes a laminate sheet, interface-connection feedthrough conductors for electrically connecting faces of the laminate sheet, and capacitor-connection feedthrough conductors. The laminate sheet has at least one laminate which is composed of a power source layer electrode, a grounding layer electrode, and a dielectric layer interposed between the power source layer electrode and the grounding layer electrode. The interface-connection feedthrough conductors are formed in through holes that pass through the dielectric layer, the power source layer electrode, and the grounding layer electrode, and are insulated by insulation walls from the power source layer electrode and the grounding layer electrode provided inside. The capacitor-connection feedthrough conductors are formed in regions where only either the power source layer electrode or the grounding layer electrode is provided, and are connected electrically with either the power source layer electrode or the grounding layer electrode. This configuration makes the electric connection for employing the capacitors and the electric connection between faces of the sheet independent from each other. Thus, it is possible to provide a capacitor sheet in which the adverse effects of inductances of vias are minimized.

5 Claims, 6 Drawing Sheets

CAPACITOR SHEET, METHOD FOR PRODUCING THE SAME, BOARD WITH BUILT-IN CAPACITORS, AND SEMICONDUCTOR DEVICE

This application is a divisional of application Ser. No. 10/155,700, filed May 24, 2002, now U.S. Pat. No. 6,756,628, which application(s) are incorporated herein by reference.

BACKGROUND OF THE INVENTION

1. Field of the Invention

The present invention relates generally to a capacitor sheet, a method for producing the same, a circuit board, and a semiconductor device, and particularly to a capacitor sheet having an improved structure suitable for mounting a semiconductor on a wiring board such as a mother board or a daughter board.

2. Related Background Art

Recently, the digitalization of circuits has been promoted in electronic apparatuses, which significantly accelerates higher-speed information processing, further size reduction, and the integration of a multiplicity of functions. This requires circuit boards to be capable of accommodating high-density circuit and mounting high-density component, so as to cope with an increase in the number of semiconductor components.

In response to the demand for high-density circuit accommodation, multilayer wiring boards having an inner via hole structure for all layers ("ALIVH" (a trademark of Matsushita Electric Industrial Co., Ltd.) structure), built-up wiring boards, etc., have been developed recently and put into practical application. Besides, as to the high-density component mounting, the technique of configuring semiconductor packages in the ball grid array (BGA) form or in the chip size package (CSP) form has been developed, whereby areas for mounting and spaces between components can be reduced considerably. Furthermore, to mount components at a further higher density, a technique of providing built-in by-pass capacitors indispensable for operations of a semiconductor inside a board, etc., has been developed.

For instance, JP 5(1993)-36857 A teaches an example in which by-pass capacitors, each of which is composed of a first conductive electrode layer, a second conductive electrode layer and a dielectric layer interposed between the foregoing two conductive electrode layers, are placed on a substrate made of silicon (Si), aluminum nitride (AlN), or the like, and a multilayer wiring layer composed of a wiring layer, an insulation layer, and the like is laminated further thereon. With this structure, semiconductor chips mounted on a surface of the lamination board and the by-pass capacitors incorporated therein are connected with each other through vias. Therefore, unlike a conventional configuration with surface-mounted chip capacitors, areas on which chip capacitors are mounted and wiring areas for connection are unnecessary on the surface of the board. This allegedly allows the degree of freedom in the arrangement of mounted components and the wiring to increase significantly, thereby allowing the high-density packaging to be implemented.

Recently, the frequencies of used signals also have been increased as integrated circuits such as ICs and LSIs have higher processing speeds and greater capacities. This leads to a problem in that switching noises generated in packages having integrated circuits built therein cause malfunctions. In high-speed, large-capacity LSI packages conventionally used, multilayer structures in which power source layers and grounding layers are formed alternately is employed to maintain the electric characteristics thereof. Besides, a multiplicity of chip capacitors as decoupling capacitors are mounted in the vicinity of a LSI of the package board or a back face of the same.

On the other hand, there is a tendency to operate a CPU at a low voltage with large current to achieve lower power consumption, and this leads to a problem in that the power supply is insufficient upon the start-up of the CPU, thereby impairing the operability. In conventional cases, to stabilize the power supply upon the start-up, an electrolytic capacitor with a large capacity is provided in the vicinity of the LSI.

Thus, it is significantly effective to provide built-in capacitors inside a board so as to achieve high-density packaging. However, this results in a wiring layer being provided immediately under a face where a component is mounted, and a capacitor layer is formed therebeneath, which means that capacitors are connected through vias that pass through several insulation layers. Therefore, there is apprehension that the inductances of the vias adversely affect the intended stabilization of the power supply.

SUMMARY OF THE INVENTION

It is an object of the present invention to provide a capacitor sheet configured so that the electric connection for employing capacitors and the electric connection between faces of the sheet are independent from each other and adverse effects of inductances of vias are eliminated, as well as a method for producing the capacitor sheet. It is also an object of the present invention to provide a board with built-in capacitors in which the foregoing capacitor sheet is employed, and a semiconductor device in which the foregoing capacitor sheet is employed.

A capacitor sheet of the present invention includes a laminate sheet, an interface-connection feedthrough conductors for electrically connecting faces of the laminate sheet, and capacitor-connection feedthrough conductors. The laminate sheet has at least one laminate that is composed of a power source layer electrode, a grounding layer electrode, and a dielectric layer interposed between the power source layer electrode and the grounding layer electrode. The interface-connection feedthrough conductors are formed in through holes that pass through the dielectric layer, the power source layer electrode, and the grounding layer electrode, and are insulated by insulation walls from the power source layer electrode and the grounding layer electrode provided inside. The capacitor-connection feedthrough conductors are formed in regions where only either the power source layer electrode or the grounding layer electrode is provided, and are connected electrically with either the power source layer electrode or the grounding layer electrode.

This configuration makes the electric connection for employing the capacitors and the electric connection between the faces of the sheet independent from each other. It should be noted that the number of the foregoing laminates normally is approximately 2 to 100, but the number may be more than 100 when necessary.

A method for producing a capacitor sheet according to the present invention is a method for producing the foregoing capacitor sheet, and a step thereof for forming the interface-connection feedthrough conductors include the sub-steps of forming large-diameter perforations in the laminate sheet, filling an insulator in the large-diameter perforations, forming small-diameter perforations in the large-diameter perforations filled with the insulator, and providing feedthrough conductors in the small-diameter perforations.

A board with built-in capacitors according to the present invention is a board in which the above-described capacitor sheet is laminated. In the foregoing board, printed circuit boards laminated on both faces of the capacitor sheet are connected electrically with each other via the interface-connection feedthrough conductors, and connection between the power source layer electrode and the grounding layer electrode of the capacitor sheet is achieved by the capacitor-connection feedthrough conductors.

The foregoing configuration in which the multilayer lamination capacitor is employed makes it possible to increase the capacity for power supply. Besides, by dividing the multilayer lamination capacitor into predetermined capacitances and arranging the same, it is possible to apply the same to various functions. Furthermore, since this configuration allows capacitors to be built as arbitrary layers, the capacitor layer can be formed immediately under a mounted component, or in other words, in an outermost layer of the board, thereby allowing the via connection with capacitors to be minimized in length. This makes it possible to suppress the influence of inductances of vias to a minimum degree, thereby allowing the stabilization of power supply to be achieved more effectively. Furthermore, the provision of vias that pass through a capacitor layer so as to be connected with a layer beneath the same enables wiring connection in internal layers with a higher degree of freedom, thereby facilitating the designing.

A semiconductor device of the present invention includes a resin multilayer board with signal wiring layers formed on and inside the same, the above-described capacitor sheet provided and connected in the resin multilayer board, and a semiconductor chip mounted on the resin multilayer board by flip chip mounting. Alternatively, it may be configured to include a semiconductor chip carrier mounted on the resin multilayer board, in place of the semiconductor chip.

Furthermore, a semiconductor device of the present invention includes a resin multilayer board with signal wiring layers formed on and inside the same, the above-described capacitor sheet provided and connected in the resin multilayer board, and a semiconductor chip mounted on the capacitor sheet by flip chip mounting. Alternatively, it may be configured to include a semiconductor chip carrier mounted on the capacitor sheet, in place of the semiconductor chip.

DETAILED DESCRIPTION OF THE INVENTION

Figure 1:
FIG. 1 is a cross-sectional view illustrating a structure of a capacitor sheet according to a first embodiment of the present invention.

The following will describe embodiments of the present invention, while referring to the drawings. It should be noted that examples of capacitor sheets applicable in the present invention include multilayer capacitors employing ceramic green sheets, multilayer capacitors obtained by film lamination, and multilayer capacitors obtained by vacuum processing such as sputtering or CVD.

First Embodiment

FIG. 1 is a cross-sectional view illustrating a structure of a capacitor sheet according to the first embodiment of the present invention. The capacitor sheet is obtained by laminating a multiplicity of laminates, each of which is obtained by laminating a dielectric layer 1 and counter electrodes 2a and 2b. One of the counter electrodes 2a and 2b is employed as a power source layer electrode, and the other is used as a grounding layer electrode.

To electrically connect upper and lower faces of the multilayer laminate, through holes are provided so as to pierce the dielectric layers 1 and the counter electrodes 2a and 2b. In each through hole, a feedthrough hole conductor 4 is provided, which is insulated by an insulation wall 3 from the counter electrodes 2a and 2b provided inside. The feedthrough hole conductor 4 may be formed by metal plating. Besides, in regions where the counter electrodes 2a and 2b are not provided opposite to each other, through holes piercing the dielectric layers 1 and either the counter electrodes 2a or the counter electrodes 2b are formed so that the plurality of counter electrodes 2a are connected electrically with one another and the plurality of counter electrodes 2b are connected electrically with one another. In each of the through holes, a feedthrough hole conductor 4a or 4b is provided.

The foregoing structure allows the capacitors to be utilized by employing the feedthrough hole conductors 4a and 4b, and allows electric signals to be sent between upper and lower faces via the feedthrough hole conductors 4 independently from the capacitors.

Second Embodiment

Figure 2:
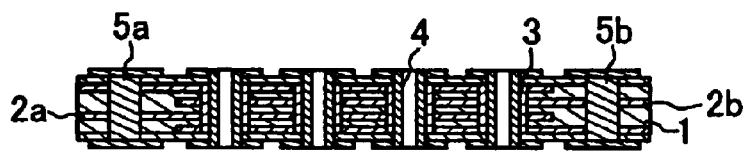
FIG. 2 is a cross-sectional view illustrating a structure of a capacitor sheet according to a second embodiment of the present invention.

FIG. 2 is a cross-sectional view illustrating a structure of a capacitor sheet according to the second embodiment of the present invention. The basic structure thereof is similar to that of the capacitor sheet shown in FIG. 1.

To electrically connect upper and lower faces of the multilayer laminate, in each of through holes provided so as to pierce the dielectric layers 1 and the counter electrodes 2a and 2b, a feedthrough hole conductor 4 is provided, which is insulated by an insulation wall 3 from the counter electrodes 2a and 2b provided inside. In the present embodiment, the structure for electrically connecting the plurality of counter electrodes 2a with one another and electrically connecting the plurality of counter electrodes 2b with one another is different from that of the first embodiment. More specifically, in regions where the counter electrodes 2a and 2b are not provided opposite to each other, through holes are formed so as to pierce the dielectric layers 1 and either the counter electrodes 2a or the counter electrodes 2b, and a feedthrough via conductor 5a or 5b is provided in each of these through holes. The feedthrough via conductors 5a and 5b are formed with a conductive paste.

The foregoing structure allows the capacitors to be utilized by employing the feedthrough via conductors 5a and 5b, and allows electric signals to be sent between upper and lower faces via the feedthrough hole conductors 4 independently from the capacitors.

Third Embodiment

Figure 3:
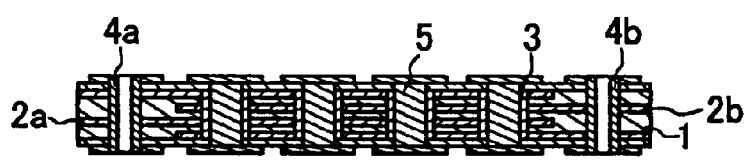
FIG. 3 is a cross-sectional view illustrating a structure of a capacitor sheet according to a third embodiment of the present invention.

FIG. 3 is a cross-sectional view illustrating a structure of a capacitor sheet according to the third embodiment of the present invention. The basic structure thereof is similar to that of the capacitor sheet shown in FIG. 1.

In the present embodiment, the structure for electrically connecting upper and lower faces of the multilayer laminate is different from that of the first embodiment. More specifically, in each of the through holes provided so as to pierce the dielectric layers 1 and the counter electrodes 2a and 2b, a feedthrough via conductor 5 is provided, which is insulated by an insulation wall 3 from the counter electrodes 2a and 2b provided inside. Besides, to electrically connect the plurality of counter electrodes 2a with one another and to electrically connect the plurality of counter electrodes 2b with one another, through holes are formed in regions where the counter electrodes 2a and 2b are not provided opposite to each other so that each through hole should pierce the dielectric layers 1 and either the counter electrodes 2a or the counter electrodes 2b, and a feedthrough hole conductor 4a or 4b is provided in each of these through holes.

The foregoing structure allows the capacitors to be utilized by employing the feedthrough hole conductors 4a and 4b, and allows electric signals to be sent between upper and lower faces via the feedthrough via conductors 5 independently from the capacitors.

Fourth Embodiment

Figure 4:
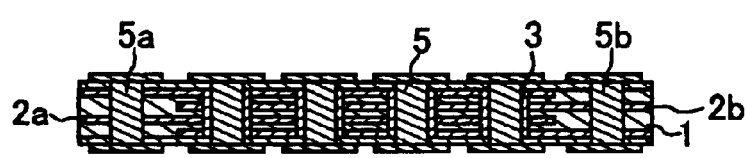
FIG. 4 is a cross-sectional view illustrating a structure of a capacitor sheet according to a fourth embodiment of the present invention.

FIG. 4 is a cross-sectional view illustrating a structure of a capacitor sheet according to the fourth embodiment of the present invention. The basic structure thereof is similar to that of the capacitor sheet shown in FIG. 1. In the present embodiment, all the structures for electric connection are formed with feedthrough via conductors.

To electrically connect upper and lower faces of the multilayer laminate, in each of the through holes provided so as to pierce the dielectric layers 1 and the counter electrodes 2a and 2b, a feedthrough via conductor 5 is provided, which is insulated by an insulation wall 3 from the counter electrodes 2a and 2b provided inside. Besides, to electrically connect the plurality of counter electrodes 2a with one another and to electrically connect the plurality of counter electrodes 2b with one another, through holes are formed in regions where the counter electrodes 2a and 2b are not provided opposite to each other so that each of the through hole should pierce the dielectric layers 1 and either the counter electrodes 2a or the counter electrodes 2b, and a feedthrough via conductor 5a or 5b is provided in each of these through holes.

The foregoing structure allows the capacitors to be utilized by employing the feedthrough via conductors 5a and 5b, and allows electric signals to be sent between upper and lower faces via the feedthrough via conductors 5 independently from the capacitors.

Figure 5:
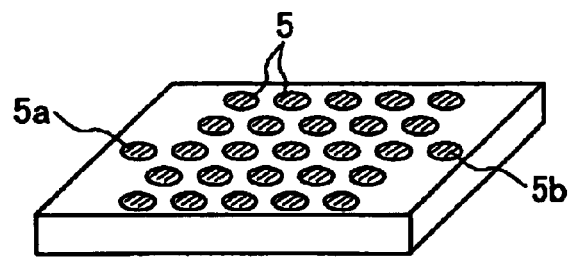
FIG. 5 is a perspective view illustrating a structure of a capacitor sheet of the present invention.

FIG. 5 illustrates an example of a planar arrangement of the feedthrough via conductors 5, 5a, and 5b.

Fifth Embodiment

The following will describe a capacitor sheet producing process according to the fifth embodiment of the present invention, while referring to FIGS. 6A to 6L.

Figure 6A:
FIGS. 6A to 6L are cross-sectional views illustrating a process for producing a capacitor sheet, according to a fifth embodiment of the present invention.
Figure 6B:
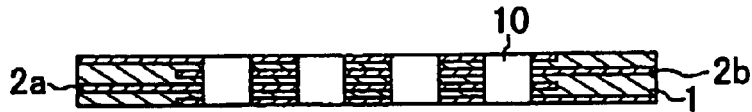

First of all, as shown in FIG. 6A, a multilayer capacitor sheet in which dielectric layers 1, counter electrodes 2a, and counter electrodes 2b are laminated is produced by a known technique. Next, as shown in FIG. 6B, perforations 10 are formed at necessary positions in regions where the counter electrodes 2a and 2b are provided opposite to each other. Herein the perforations can be formed by drilling or laser beam machining.

Figure 6C:

Then, as shown in FIG. 6C, an insulator paste 11 may be filled in the perforations 10. The insulator paste 11 may contain an inorganic filler having an insulating property. In the case where the insulator paste 11 contains a thermosetting resin, the following steps are carried out after curing.

Figure 6D:

As shown in FIG. 6D, films, each of which is formed by laminating an adhesive layer 13 on a release film 12, are laminated on both sides of the capacitor sheet shown in FIG. 6C. In this case, as shown in the drawing, the films are laminated thereon so that the adhesive layers 13 are brought in contact with the faces of the capacitor sheet. For the laminating process, a known technique such as laminating or pressing can be applied.

Figure 6E:
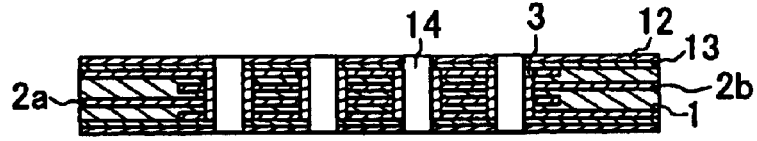

Then, as shown in FIG. 6E, in the insulator paste 11, perforations 14 are formed with a smaller diameter than that of the perforations filled with the insulator paste 11. Thus, a structure of perforations 14 arranged in insulation walls 3 is formed. For this hole forming process also, drilling or laser beam machining can be applied. Each perforation 14 preferably is concentric with the insulator paste 11.

Figure 6F:

Subsequently, as shown in FIG. 6F, a conductive paste 5 is filled in the perforations 14. A screen printing device is employed for the filling process, so that the conductive paste 5 is printed directly from above the release film 12 so as to be filled therein. Here, by vacuum absorption via a porous sheet such as Japanese paper from the side opposite to the printed side, a resin component in the conductive paste 5 in the perforations 14 is sucked up, thereby increasing a content of a conductive component. By so doing, the conductive component can be filled therein more densely. In this process, the release film 12 performs a function as a printing mask as well as performs a function in protecting the surface of the adhesive layer 13 from dust and dirt.

Figure 6G:
Figure 6H:
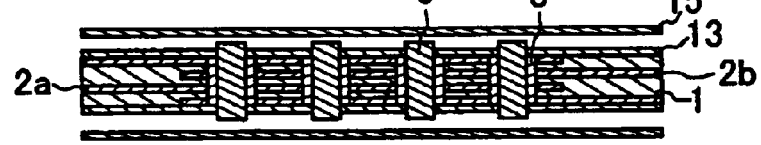
Figure 6I:

Next, as shown in FIG. 6G, the release films 12 are removed from both of the faces of the capacitor sheet. Then, as shown in FIG. 6H, metal foils 15 are laminated on both of the faces of the capacitor sheet, and heated and compressed. The heating and compressing is carried out, for instance, with a vacuum press. This heating and compressing causes the adhesive layers 13 and the conductive paste 5 to be thermo-set, whereby a capacitor sheet with the metal foils 15 adhered thereto is formed, as shown in FIG. 6I.

Figure 6J:
Figure 6K:
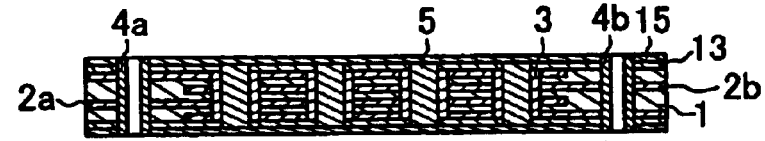
Figure 6L:
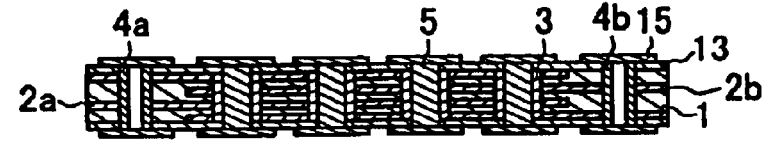

Subsequently, as shown in FIG. 6J, perforations 16 are formed in regions where only either the counter electrodes 2a or the counter electrodes 2b are arranged. Furthermore, as shown in FIG. 6K, the perforations 16 are plated with a conductive material, so that feedthrough hole conductors 4a and 4b are formed. Finally, as shown in FIG. 6L, the metal foils 15 on both of the sides are patterned by photolithoetching.

Sixth Embodiment

FIGS. 7A to 7J are cross-sectional views illustrating a capacitor sheet producing process according to the sixth embodiment of the present invention.

Figure 7A:
FIGS. 7A to 7J are cross-sectional views illustrating a process for producing a capacitor sheet, according to a sixth embodiment of the present invention.
Figure 7B:
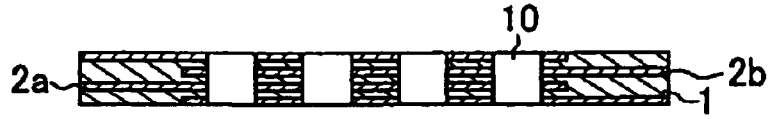

First of all, as shown in FIG. 7A, a multilayer capacitor sheet in which dielectric layers 1, counter electrodes 2a, and counter electrodes 2b are laminated is produced by a known technique. Next, as shown in FIG. 7B, perforations 10 are formed at necessary positions in regions where the counter electrodes 2a and 2b are provided opposite to each other. Herein, the perforations can be formed by drilling or laser beam machining.

Figure 7C:
Figure 7D:

Then, as shown in FIG. 7C, an insulator paste 11 may be filled in the perforations 10. The insulator paste 11 may contain an inorganic filler having an insulating property. In the case where the insulator paste 11 contains a thermosetting resin, after curing the same, films each of which is formed by laminating an adhesive layer 13 on a release film 12 are laminated, as shown in FIG. 7D, on both sides of the capacitor sheet shown in FIG. 7C. Here, as shown in the drawing, the films are laminated so that the adhesive layers 13 are brought in contact with faces of the capacitor sheet. For the laminating process, a known technique such as laminating or pressing can be used.

Figure 7E:
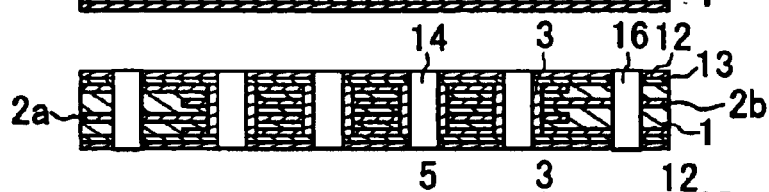

Then, as shown in FIG. 7E, in the insulator paste 11, perforations 14 are formed with a smaller diameter than that of the perforations filled with the insulator paste 11. Thus, a structure of perforations 14 arranged in insulation walls 3 is formed. For this hole forming process also, drilling or laser beam machining can be applied. Each perforation 14 preferably is concentric with the insulator paste 11. Further, in regions where only either the counter electrodes 2a or the counter electrodes 2b are provided, perforations 16 are formed. For this hole forming process also, drilling or laser beam machining can be applied. Each perforation 14 preferably is concentric with the insulator paste 11.

Figure 7F:

Subsequently, as shown in FIG. 7F, a conductive paste 5 is filled in the perforations 14 and 16. A screen printing device is employed for the filling process, so that the conductive paste 5 is printed directly from above the release film 12 so as to be filled therein. Here, by vacuum absorption via a porous sheet such as Japan paper from the side opposite to the printed side, a resin component in the conductive paste 5 in the perforations 14 and 16 is sucked up, thereby increasing a content of a conductive component. By so doing, the conductive component can be filled therein more densely. In this process, the release film 12 performs a function as a printing mask as well as performs a function in protecting the surface of the adhesive layer 13 from dust and dirt.

Figure 7G:
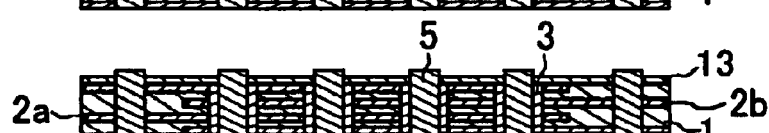
Figure 7H:
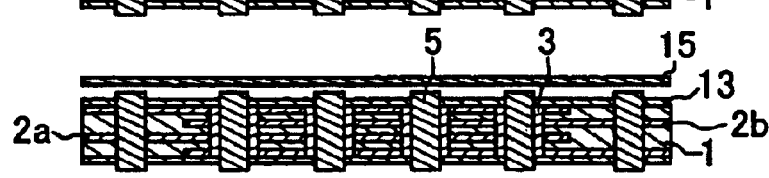
Figure 7I:
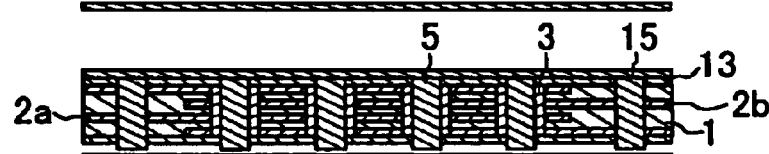

Next, as shown in FIG. 7G, the release films 12 are removed from both of the faces of the capacitor sheet. Then, as shown in FIG. 7H, metal foils 15 are laminated on both of the faces of the capacitor sheet, and heated and compressed. The heating and compressing is carried out, for instance, by vacuum press. This heating and compressing causes the adhesive layers 13 and the conductive paste 5 to be thermo-set, whereby a capacitor sheet with the metal foils 15 adhered thereto is formed, as shown in FIG. 7I.

Figure 7J:
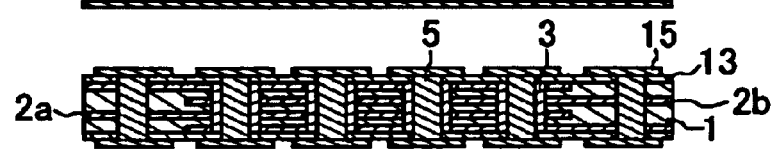

Subsequently, as shown in FIG. 7J, the metal foils 15 on both of the sides are patterned by photolithoetching.

Seventh Embodiment

Figure 8:
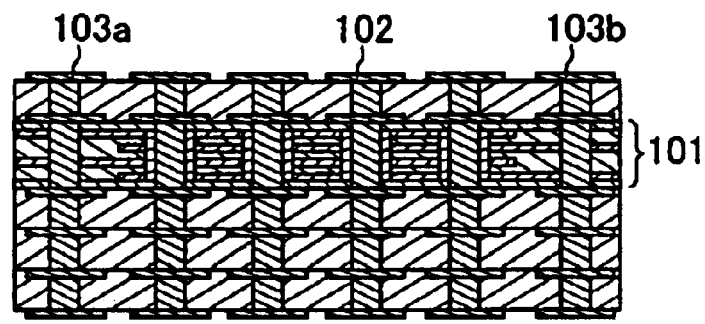
FIG. 8 is a cross-sectional view illustrating a board with a built-in capacitor sheet, according to a seventh embodiment of the present invention.

FIG. 8 is a cross-sectional view of a multilayer board according to the seventh embodiment. A capacitor sheet of the present invention is built in the multilayer board. In FIG. 8, 101 denotes a capacitor sheet. Connection between upper and lower faces of the board is obtained by feedthrough electrodes 102. On the other hand, built-in capacitors can be utilized by employing electrodes 103a and 103b.

Eighth Embodiment

Figure 9:
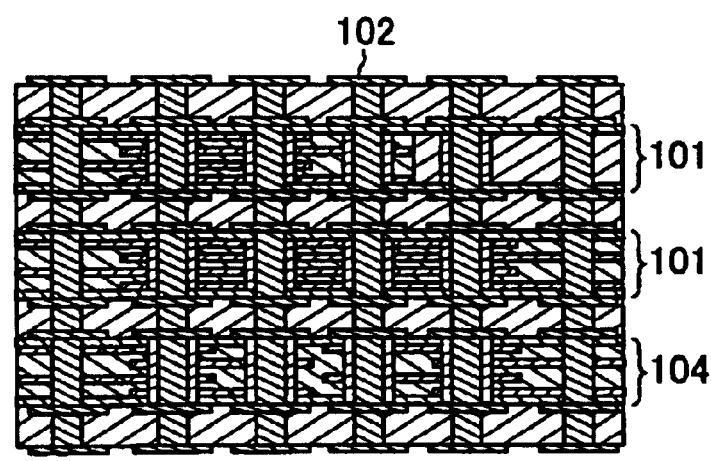
FIG. 9 is a cross-sectional view illustrating a board with built-in capacitor sheets, according to an eighth embodiment of the present invention.

FIG. 9 is a cross-sectional view of a multilayer board according to the eighth embodiment. A multiplicity of capacitor sheets 101 and 104 are built in the foregoing multilayer board. The board is capable of accommodating the capacitor sheet 101 of an arbitrary size in an arbitrary layer. Besides, a capacitor sheet whose inside is divided beforehand, as the capacitor sheet 104, can be employed.

Ninth Embodiment

Figure 10:
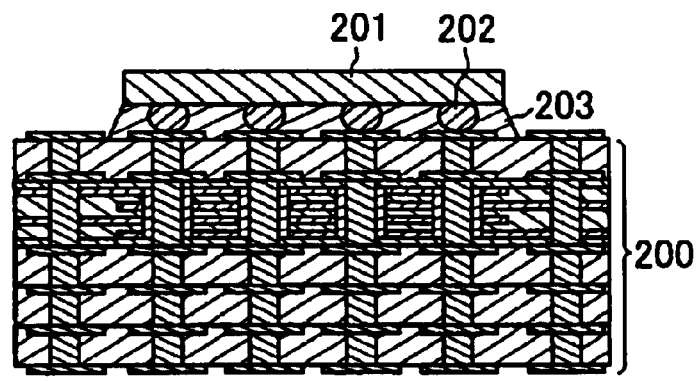
FIG. 10 is a cross-sectional view illustrating a semiconductor device according to a ninth embodiment of the present invention.

FIG. 10 is a cross-sectional view illustrating a semiconductor device according to the ninth embodiment. The foregoing semiconductor device is obtained by mounting a semiconductor on the board with built-in capacitors according to the present invention.

In FIG. 10, 200 denotes a multilayer board with a capacitor sheet built therein. A semiconductor chip 201 is mounted on a face of the multilayer board 200 so as to be connected therewith via flip-chip connecting elements 202. The mounting technique applied herein may be a conventional known mounting technique such as solder bonding. Furthermore, an underfill 203 may be provided as required.

Tenth Embodiment

Figure 11:
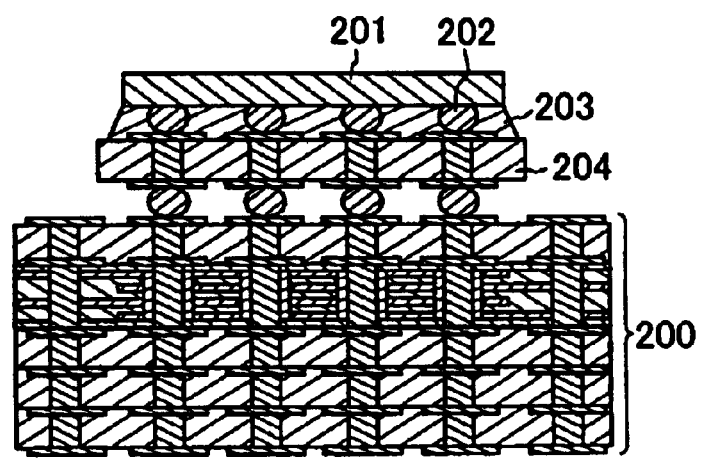
FIG. 11 is a cross-sectional view illustrating a semiconductor device according to a tenth embodiment of the present invention.

FIG. 11 is a cross-sectional view illustrating a semiconductor device according to the tenth embodiment. In the foregoing semiconductor device, a carrier board 204 on which a semiconductor chip 201 is mounted primarily thereon beforehand is mounted secondarily on a face of a multilayer board 200 with a built-in capacitor sheet. The semiconductor chip 201 is connected with a surface of the carrier board 204 via flip-chip connecting elements 202. The mounting technique applied herein may be a conventional known mounting technique such as solder bonding.

Eleventh Embodiment

Figure 12:
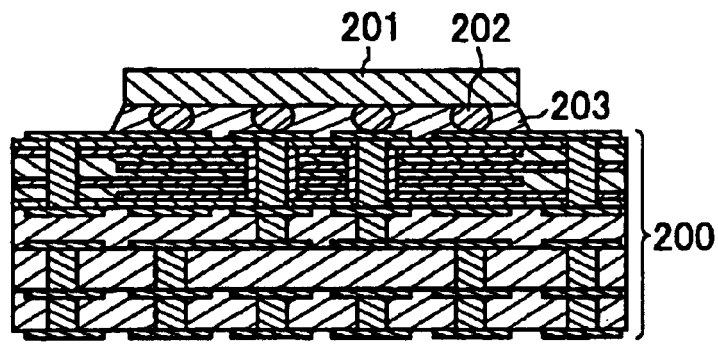
FIG. 12 is a cross-sectional view illustrating a semiconductor device according to an eleventh embodiment of the present invention.

FIG. 12 is a cross-sectional view illustrating a semiconductor device according to the eleventh embodiment. The foregoing semiconductor device has a configuration substantially similar to that of the ninth embodiment except that a semiconductor chip mounted on a capacitor sheet via flip chips is provided.

Twelfth Embodiment

Figure 13:
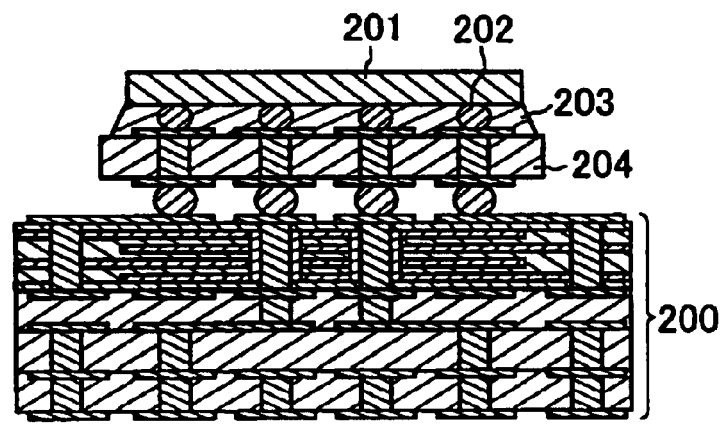
FIG. 13 is a cross-sectional view illustrating a semiconductor device according to a twelfth embodiment of the present invention.

FIG. 13 is a cross-sectional view illustrating a semiconductor device according to the twelfth embodiment. The foregoing semiconductor device has a configuration substantially similar to that of the tenth embodiment except that a semiconductor chip carrier mounted on a capacitor sheet is provided.

According to the present invention, in a multilayer lamination capacitor sheet, the configuration for the electric feedthrough between upper and lower faces and the capacitor electrodes can be employed independently from each other. Therefore, it is possible to form a capacitor layer immediately under a mounted component, or in other words, on an outermost layer of a board. Accordingly, via connecting elements for connection with capacitors can be minimized in length, which allows influences of inductances of vias to be suppressed to a minimum degree. This results in more effectively improved stabilization of the power supply.

Furthermore, the provision of vias that pass through a capacitor layer so as to be connected with a layer beneath the same enables wiring connection in internal layers with a higher degree of freedom, thereby facilitating the designing.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a capacitor sheet comprising:
   a laminate sheet having at least one laminate that is composed of a power source layer electrode, a grounding layer electrode, and a dielectric layer interposed between the power source layer electrode and the grounding layer electrode;
   interface-connection feedthrough conductors for electrically connecting faces of the laminate sheet, the interface-connection feedthrough conductors being formed in through holes that pass through the dielectric layer, the power source layer electrode, and the grounding layer electrode, and being insulated by insulation walls from the power source layer electrode and the grounding layer electrode provided inside; and
   capacitor-connection feedthrough conductors that are formed in regions where only either the power source layer electrode or the grounding layer electrode is provided, and that are connected electrically with either the power source layer electrode or the grounding layer electrode;
   the method comprising the step of forming the interface-connection feedthrough conductors, wherein said step includes sub-steps of:
   forming large-diameter perforations in the laminate sheet;
   filling an insulator in the large-diameter perforations;
   forming small-diameter perforations in the large-diameter perforations filled with the insulator; and
   providing feedthrough conductors in the small-diameter perforations.

2. The method according to claim 1, wherein the sub-step of providing feedthrough conductors is performed by metal plating to inner walls of the small-diameter perforations.

3. The method according to claim 1, wherein the sub-step of providing feedthrough conductors is performed by conductive paste connection of the small-diameter perforations.

4. The method according to claim 1, wherein the insulator filled in the large-diameter perforations formed in the laminate sheet is a thermosetting resin.

5. The method according to claim 4, wherein the insulator filled in the large-diameter perforations formed in the laminate sheet contains an inorganic filler.

* * * * *